United States Patent
Moraveji

(10) Patent No.: US 8,067,983 B2
(45) Date of Patent: Nov. 29, 2011

(54) HIGH BANDWIDTH, RAIL-TO-RAIL DIFFERENTIAL AMPLIFIER WITH INTERMEDIATE STAGE CURRENT AMPLIFIER

(75) Inventor: Farhood Moraveji, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 178 days.

(21) Appl. No.: 12/708,897

(22) Filed: Feb. 19, 2010

(65) Prior Publication Data

US 2010/0225393 A1 Sep. 9, 2010

Related U.S. Application Data

(60) Provisional application No. 61/158,629, filed on Mar. 9, 2009.

(51) Int. Cl.
 *H03F 3/45* (2006.01)
(52) U.S. Cl. .................. 330/257; 330/261; 330/255
(58) Field of Classification Search .................. 330/257, 330/261, 255
 See application file for complete search history.

(56) References Cited

U.S. PATENT DOCUMENTS

| | | | |
|---|---|---|---|
| 3,987,369 A * | 10/1976 | Yokoyama | 330/253 |
| 5,361,041 A * | 11/1994 | Lish | 330/255 |
| 5,442,320 A | 8/1995 | Kunst et al. | |
| 5,659,266 A | 8/1997 | Shacter et al. | |
| 5,786,731 A | 7/1998 | Bales | |
| 6,078,220 A * | 6/2000 | Bales | 330/264 |
| 6,963,244 B1 * | 11/2005 | Carter | 330/252 |
| 7,109,802 B2 * | 9/2006 | Alenin | 330/301 |
| 7,557,659 B2 | 7/2009 | Harvey | |
| 2009/0002075 A1 * | 1/2009 | Chilakapati et al. | 330/297 |

OTHER PUBLICATIONS

Non-Final Office Action for U.S. Appl. No. 12/708,880; Applicant: Monolithic Power Systems, Inc.; Date of Mailing: Jan. 26, 2011 (6 pages).

* cited by examiner

*Primary Examiner* — Patricia Nguyen
(74) *Attorney, Agent, or Firm* — Perkins Coie LLP

(57) ABSTRACT

An error amplifier expected to exhibit rail-to-rail operation, high bandwidth, and high slew rate, is described, the error amplifier comprising a first stage to receive an input differential voltage and to provide transconductance gain, an intermediate stage to provide current gain, and an output stage to drive a load.

7 Claims, 3 Drawing Sheets

US 8,067,983 B2

HIGH BANDWIDTH, RAIL-TO-RAIL DIFFERENTIAL AMPLIFIER WITH INTERMEDIATE STAGE CURRENT AMPLIFIER

CROSS-REFERENCE TO RELATED APPLICATION(S)

This application claims the benefit of U.S. Provisional Application No. 61/158,629, filed on Mar. 9, 2009, which is incorporated herein by reference in its entirety.

FIELD

The present invention relates to analog circuits, and in particular to operational amplifiers.

BACKGROUND

Operational amplifiers find widespread applications in many analog circuits. In many applications, it is desirable for operational amplifiers to have wide bandwidth, large slew rate, and to exhibit rail-to-rail operation from a low operating voltage of about 1.8V to voltages of about 18V.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1A:
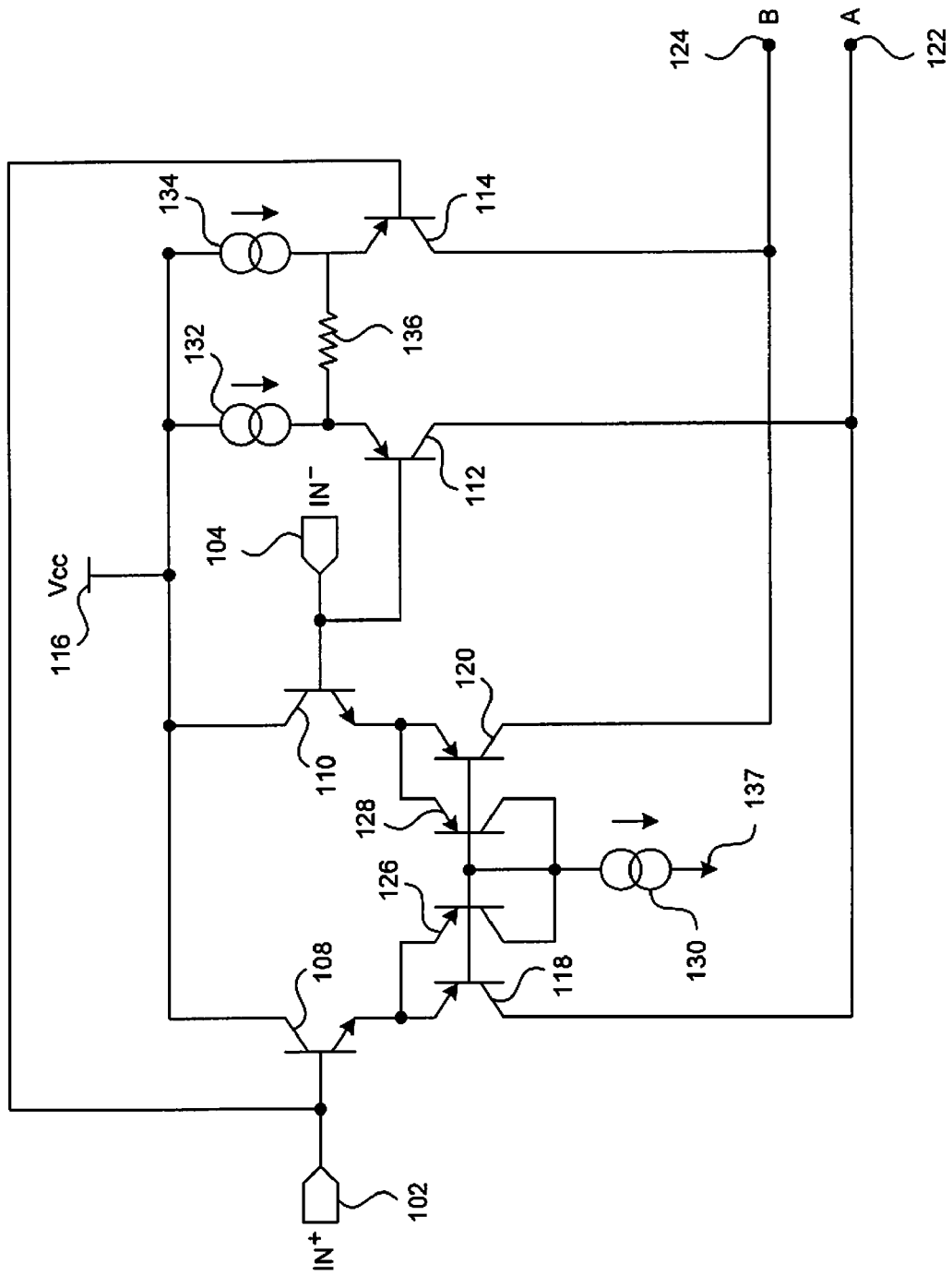
FIGS. 1A, 1B, and 1C illustrate stages of an error amplifier according to an embodiment.
Figure 1B:
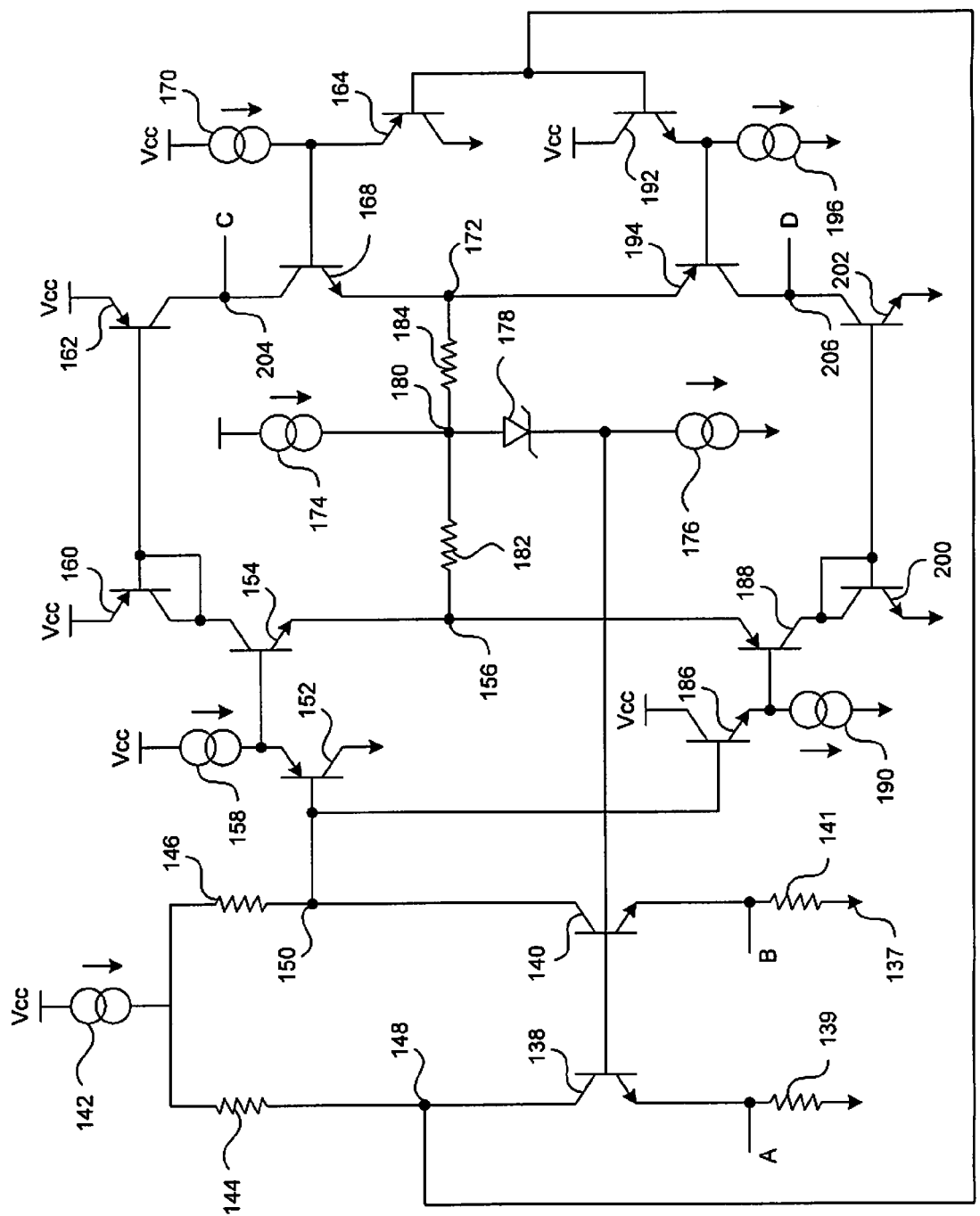
Figure 1C:
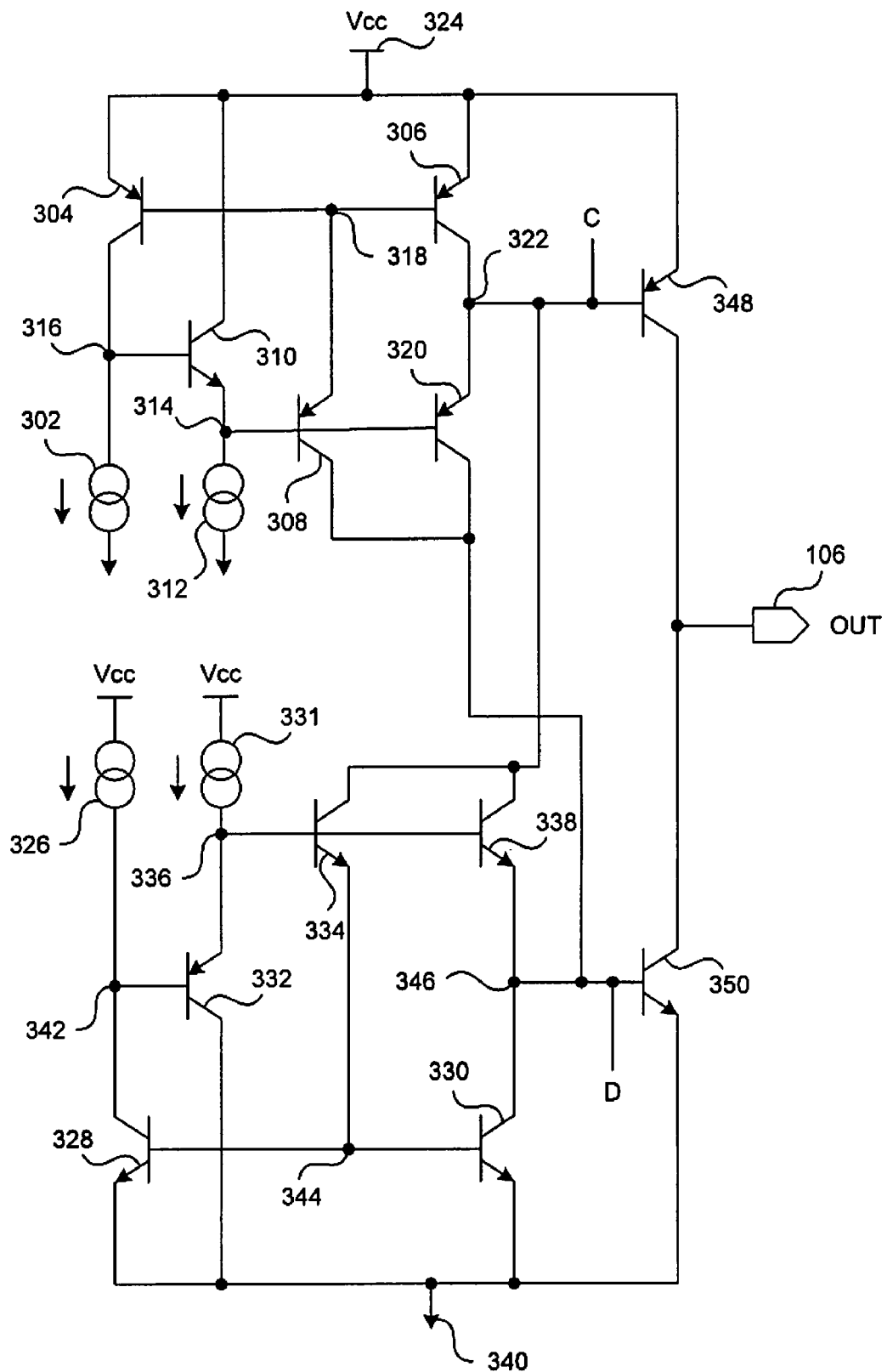

FIGS. 1A, 1B, and 1C together illustrate at the circuit level a rail-to-rail operational amplifier according to an embodiment, where ports 102 and 104 in FIG. 1A are the input ports of the operational amplifier, and port 106 in FIG. 1C is the output port of the operational amplifier. One of input ports 102 and 104 may be designated as a positive (or non-inverting) input port, and the other a negative (or inverting) input port. In the particular embodiment of FIGS. 1A, 1B, and 1C, input port 102 is taken as the positive input port, and input port 104 is taken as the negative input port.

Each of FIGS. 1A, 1B, and 1C illustrates a section of an embodiment, where the electrical connections from one section to the next are indicated by the letters "A", "B", "C", and "D". For example, referring to FIGS. 1A and 1B, node "A" in FIG. 1A is connected to node "A" in FIG. 1B, and node "B" in FIG. 1A is connected to node "B" in FIG. 1B. Similar remarks apply to the other nodes in these three figures.

The circuit in FIG. 1A may be viewed as an input stage, or a portion of an input stage, and serves as a rail-to-rail transconductance amplifier to convert a differential voltage at input ports 102 and 104 to a differential current at nodes A and B.

The circuit of FIG. 1A comprises differential pair 108 and 110, and differential pair 112 and 114. Input port 102 is connected to the base of NPN transistor 108 and PNP transistor 114, and input port 104 is connected to the base of NPN transistor 110 and PNP transistor 112. The collectors of NPN transistors 108 and 110 are connected to supply voltage rail 116 (the $V_{CC}$ rail); and these transistors are configured as followers so that the voltage at the emitter of transistor 108 follows the voltage at input port 102, and the voltage at the emitter of transistor 110 follows the voltage at input port 104.

Transistors 118 and 120 transform impedances, so that the impedance looking into the collector of PNP transistor 118 is substantially higher than the impedance looking into the emitter of transistor 108, and the impedance looking into the collector of PNP transistor 120 is substantially higher than the impedance looking into the emitter of transistor 110. In this way, differential pair 108 and 110, and transistors 118 and 120, do not appreciably load nodes 122 and 124.

The bases of transistors 118 and 120 are biased by the combination of PNP transistors 126 and 128, and current source 130. (Although component 130 may properly be referred to as a current sink, the convention is followed whereby a current sink may be referred to as a current source. This simplifies the description of the embodiments.)Transistors 126 and 128 are diode-connected, with their bases and collectors connected to one another and to current source 130. The emitter of transistor 126 is connected to the emitter of transistor 118, and the emitter of transistor 128 is connected to the emitter of transistor 120. In this way, the bases of transistors 118 and 120 are biased so that their large-signal collector currents may be set by choosing the device sizes of transistors 126 and 128 relative to transistors 118 and 120, respectively, and by choosing the size of current source 130.

The emitter of PNP transistor 112 is biased by current source 132, and the emitter of PNP transistor 114 is biased by current source 134. For the particular embodiment of FIG. 1A, current sources 132 and 134 are sized to source the same amount of current. The collector of transistor 112 is connected to node 122, and the collector of transistor 114 is connected to node 124. In this way, the collector currents of transistors 112 and 118 add together at node 122, and the collector currents of transistors 114 and 120 add together at node 124.

The input-output transconductance relationship for the circuit of FIG. 1A may be expressed in various ways. One way is to consider variations of the input and output signals about their respective common-mode values. The common-mode value for a pair of signals may be viewed as the midpoint or average of the pair. With this interpretation, a differential voltage $\Delta v_{in}$ at input nodes 102 and 104 means that the voltage at input node 102 is $$\frac{\Delta v_{in}}{2}$$

above the common-mode input voltage, and the voltage at input node 104 is $$\frac{\Delta v_{in}}{2}$$

below the common-mode input voltage; and a differential output current $\Delta i$ at nodes 122 and 124 means that the current sourced into node 122 by the circuit of FIG. 1A is $\Delta i$ above the common-mode output current, and the current sourced into node 124 is $\Delta i$ below the common-mode output current. The common-mode output current depends upon the various devices and current sources shown in FIG. 1A, and the common-mode input voltage.

The relationship between the differential output current $\Delta i$ and the differential input voltage $\Delta v_{in}$ may be expressed, to sufficient accuracy, as a linear relationship $\Delta i = g_{m1} \Delta v_{in}$, where the transconductance gain $g_{m1}$ depends upon the device parameters chosen for the transistor pairs in FIG. 1A. This input-output transconductance expression assumes that the transistors in each differential pair are matched. That is, for the particular embodiment of FIG. 1A, transistors 108 and 110 are matched to each other so that they have the same transconductance, and similarly for transistors 112 and 114. Transistors 118 and 120 are matched, and transistors 126 and 128 are matched. It is also to be appreciated that in theory the input-output relationship is not exactly linear, but in practice a linear expression is sufficiently accurate for purposes of describing an embodiment.

Using transistors for differential pair 108 and 110 of a type complementary to the transistors for differential pair 112 and 114 (e.g., NPN transistors for differential pair 108 and 110, and PNP transistors for differential pair 112 and 114) allows rail-to-rail operation for the circuit of FIG. 1A. If the common-mode voltage at input ports 102 and 104 comes close to the ground (or substrate) voltage of ground rail 137 so that there is not sufficient headroom for differential pair 108 and 110 to operate properly, then differential pair 112 and 114 may still operate properly; whereas, if the common-mode voltage at input ports 102 and 104 comes close to the voltage of supply voltage rail 116 ($V_{CC}$) so that there is not sufficient headroom for differential pair 112 and 114 to operate properly, then differential pair 108 and 110 may still operate properly.

Referring now to FIG. 1B, the labels "A" and "B" in FIGS. 1A and 1B indicate that the emitter of transistor 138 and resistor 139 are connected to node 122, and the emitter of transistor 140 and resistor 141 are connected to node 124. For the particular embodiment of FIG. 1B, resistors 139 and 141 are matched to each other, transistors 138 and 140 are matched to each other, and load resistors 144 and 146 are matched to each other.

Let $l_0$ denote the current sourced by current source 142, suppose l is the common-mode current provided by the input stage of FIG. 1A, and suppose that the input stage of FIG. 1A sources the current l+Δi into node 122 and the current l−Δi into node 124. To a good approximation the circuit of FIG. 1B operates such that substantially equal currents flow through resistors 139 and 141, so that the current $$\frac{l + l_0}{2}$$

flows through each of resistors 139 and 141, the current $$\frac{l_0}{2} - \Delta i$$

flows through resistor 144 in the direction toward node 148, and the current $$\frac{l_0}{2} + \Delta i$$

flows through resistor 146 in the direction toward node 150. That is, the small-signal current lΔi is sourced through resistor 144 in a direction toward node 148, and the small-signal current Δi is sourced through resistor 146 in a direction toward node 150.

Denoting the resistance value of load resistors 144 and 146 as $R_L$, a small-signal voltage $$\frac{\Delta v}{2}$$

is developed at node 148 and a small-signal voltage $$l\frac{\Delta v}{2}$$

is developed at node 150, where Δv is the differential voltage at nodes 148 and 150. In terms of the differential current Δi discussed above, $\Delta v = 2\Delta i R_L = 2g_{m1} R_L \Delta v_{in}$. To help ensure proper operation, e.g., so that performance is substantially independent of process variation, the common-mode voltage at nodes 148 and 150 should be prevented from exhibiting wide swings, and should be held to a substantially constant value for a constant common-mode current I. The bases of transistors 138 and 140 are biased so that the common-mode voltage at nodes 148 and 150 is kept within a useful range to ensure that the above expression for Δv is substantially valid for rail-to-rail operation. This is accomplished by the use of a negative feedback loop, which will be discussed later.

The output nodes (or ports) for the circuit of FIG. 1B are nodes 204 and 206, labeled "C" and "D", respectively, in FIG. 1B. The portion of the operational amplifier illustrated in FIG. 1B may be viewed as an intermediate stage of the operational amplifier, with input ports "A" and "B", and output ports "C" and "D". The input signal to the input ports is the differential current Δi discussed previously, and the output signal at the output ports is a current. The intermediate stage represented by the circuit of FIG. 1B is a current amplifier, and its current gain will be denoted as $g_i$. This current gain $g_i$ may be calculated is as follows.

Two class AB buffers couple nodes 150 and 148 to nodes 156 and 172. Transistors 152, 154, 186, and 188 form part of a class AB buffer; where current source 158 provides bias current to transistor 152, and transistor 160 (which is part of a current mirror comprising transistors 160 and 162) provides bias current to transistor 154; and current source 190 provides bias current to transistor 186, and transistor 200 (which is part of a current mirror comprising transistors 200 and 202) provides bias current to transistor 188. Another class AB buffer is provided by the combination of transistors 164, 168, 192, and 194; where current source 170 provides bias current to transistor 164, and transistor 162 provides bias current to transistor 168; and current source 196 provides bias current to transistor 192, and transistor 202 provides bias current to transistor 194.

Because of these two AB buffers, the voltage at node 172 is substantially equal to the voltage at node 148, and the voltage at node 156 is substantially equal to the voltage at node 150, so that the voltage difference between nodes 172 and 156 is substantially equal to the voltage difference between nodes 148 and 150. For example, because node 150 is connected to the base of transistor 152, and the emitter of transistor 152 is connected to the base of transistor 154, the voltage increase from node 150 to the emitter of transistor 152 is substantially cancelled out by the voltage decrease from the base of transistor 154 to node 156, so that nodes 150 and 156 have substantially the same voltage. Similar remarks apply to the other transistors forming the class AB buffers.

Using class AB buffers helps ensure that the differential voltage between nodes 156 and 172 is substantially equal to the differential voltage at nodes 150 and 148 over full rail-to-rail operation.

Under steady state in which the differential voltage at nodes 148 and 150 is zero, the differential voltage at nodes 172 and 156 is also zero so that the current through resistors 182 and 184 is zero, and because of symmetry both upper and lower portions of the two class AB buffers source the same amount of current. Portions of the class AB buffers will conduct more or less current compared to steady state when a differential voltage develops at nodes 148 and 150, and a non-zero current Δi' will flow through resistors 182 and 184. Because the differential voltage at nodes 148 and 150 appears across nodes 172 and 156, the current Δi' satisfies Δv=2Δi'$R_E$, where the resistors 182 and 184 each have the resistance $R_E$. (It has been assumed that both of the resistors 182 and 184 carry the same amount of current, which is the case when the current sources 174 and 176 are matched.)

As discussed previously, the differential voltage is also given by Δv=2Δi$R_L$, where $R_L$ is the resistance of resistors 144 and 146, so that the current gain for the stage represented by FIG. 1B is $$\Delta i' = \Delta i \frac{R_L}{R_E}.$$

Consequently, the current gain for the current amplifier stage of FIG. 1B is given by $$g_I = \frac{R_L}{R_E}.$$

By choosing a large $$\frac{R_L}{R_E} \text{ ratio,}$$

significant current gain may be achieved. Considering the concatenation of the input stage of FIG. 1A with the current amplifier stage of FIG. 1B, the input-output relationship from input ports "A" and "B" to output ports "C" and "D" may be expressed as $$\Delta i' = g_{m1} g_I \Delta v_{in} = g_m \Delta v_{in},$$

where $g_m$ is transconductance gain for the two stages of FIGS. 1A and 1B, $$g_m = g_{m1} g_I = g_{m1} \frac{R_L}{R_E}.$$

The two class AB buffers effectively convert the differential voltage Δv developed at nodes 148 and 150 into the current Δi' between nodes 172 and 156, which is mirrored by the top current mirror comprising transistors 160 and 162, and the bottom current mirror comprising transistors 200 and 202. This causes the voltage at output ports "C" and "D" (nodes 204 and 206, respectively) to be pulled down or up, depending upon the algebraic sign of Δv.

When Δv goes positive, the voltage rises at node 172 and falls at node 156, current flows through resistors 182 and 184 from node 172 to node 156, and more current is sourced by transistor 200. This is mirrored by transistors 200 and 202, so that transistor 202 sources more current, pulling current from the output stage connected to node "D" and pulling the voltage lower at node 206. Also, current is pulled from the output stage connected to node "C", and the voltage is pulled lower at node 204.

When Δv goes negative, the voltage falls at node 172 and rises at node 156, current flows through resistors 184 and 182 from node 156 to node 172, and more current is sourced by transistor 160. This is mirrored by transistors 160 and 162, so that transistor 162 sources more current, sourcing current to the output stage connected to node "C" and pulling the voltage higher at node 204. Also, current is sourced to the output stage connected to node "D", and the voltage is pulled higher at node 206.

The negative feedback loop for setting the common-mode voltage at nodes 148 and 150 will now be described. Current sources 174 and 176 are matched current sources, and provide a constant bias current to Schottky diode 178. With current sources 174 and 176 sourcing the same amount of current into and out of node 180, resistors 182 and 184 carry the same amount of current, depending upon the voltage difference between nodes 156 and 172, so that the voltage at node 180 is the average of the voltages at nodes 156 and 172, which is the common-mode voltage V. With the convention that ground rail 137 is at zero potential, adding the voltage across resistor 141, the base-to-emitter voltage of transistor 140, and the voltage across forward-biased Schottky diode 178, yields the relationship $$V = \left(I + \frac{I_0}{2}\right)R + V_{BE} + V_{SC,}$$

where R is the resistance of resistor 141, $V_{BE}$ is the base-to-emitter voltage of transistor 140, and $V_{SC}$ is the forward voltage drop across Schottky diode 178.

Consequently, for a constant common-mode current I provided by the input stage circuit of FIG. 1A to the stage of FIG. 1B, the common-mode voltage of nodes 148 and 150 is set to a substantially constant value. The feedback loop referred to above may be viewed as comprising the paths from nodes 148 and 150 to node 180, and through Schottky diode 178 to the bases of transistors 138 and 140.

To see that the above-described feedback to set the common-mode voltage is a negative feedback loop, consider a perturbation on the common-mode voltage V by adding a positive perturbation to each of the voltages at nodes 148 and 150. This will raise the voltages at nodes 156 and 172, which in turn will raise the voltage at node 180. This will cause a voltage increase at the bases of transistors 138 and 140, which will cause the voltages at nodes 148 and 150 to be pulled lower, thereby reducing the positive perturbation. This shows that the feedback loop is a negative feedback loop.

For some embodiments, the current mirror comprising transistors 160 and 162 is matched to the current mirror comprising transistors 200 and 202. Also, current sources 158, 170, 190, and 196 are matched to each other for some embodiments.

FIG. 1C is an output driver stage according to an embodiment. In describing the operation of the driver stage of FIG. 1C, it is convenient to first consider the quiescent operation in which the voltage at input port 102 is equal to the input voltage at input port 104 so that the previous stage (the circuit of FIG. 1B) neither sources nor sinks current to or from the driver stage of FIG. 1C.

Referring to FIG. 1C, current source 302 biases transistor 304, and the bases of transistors 304 and 306 are connected to each other to form a current mirror, where their base currents flow through transistor 308. Transistor 310 and current source 312 form a follower so that the voltage at node 314 follows the voltage at node 316. The discussion of the driver stage of FIG. 1C is simplified by assuming that all transistors have the same forward voltage drop of $V_F$, i.e., the $V_{BE}$ of each NPN transistor is equal to $V_F$, and the $V_{BE}$ of each PNP transistor is equal to $-V_F$. With this in mind, the voltage at node 314 is $V_F$ below the voltage of node 316, and with the base of transistor 308 connected to node 314, the voltage at node 318 is $V_F$ above the voltage at node 314, so that the voltage at node 318 is substantially the same as the voltage at node 316. The voltage at node 314 biases the base of transistor 320, so that the voltage at node 322 is also substantially the same as the voltage at nodes 316 and 318.

Denoting the voltage at supply voltage rail 324 as $V_{CC}$, during quiescent operation the voltages at nodes 316, 318, and 322 are substantially each equal to $V_{CC}-V_F$, and the voltage at the base of transistor 320 is substantially equal to $V_{CC}-2V_F$.

The bottom half of the circuit of FIG. 1C is the dual of the top half of FIG. 1C, where the roles of the PNP and NPN interchanged. Current source 326 provides bias current to transistor 328, where the bases of transistors 328 and 330 are connected to each other to form a current mirror. Current source 331 and transistor 332 are configured as a voltage follower. Transistor 334 provides the base currents to transistors 328 and 330. The voltage at node 336 biases the base of transistor 338. Taking the convention that the voltage of ground rail 340 is zero, and continuing with the simplification that the forward voltage drop of each transistor in the bottom half of the circuit of FIG. 1C is $V_F$, the voltages at nodes 342, 344, and 346 are substantially each equal to $V_F$, and the voltage at the base of transistor 338 is substantially equal to $2V_F$.

The circuit of FIG. 1C is symmetrical in the sense that the relative physical sizes of the transistors in the top half of FIG. 1C is also shared among the transistors in the bottom half of FIG. 1C. In practice, transistor 306 may be sized larger than transistor 304 so as to source more current than transistor 304. By symmetry, it also follows that in practice transistor 330 is sized larger than transistor 328 so as to source more current than transistor 328.

The current provided by transistor 306 is sourced into transistor 320, and into transistors 334 and 338. Similarly, the current provided by transistor 330 is sourced into transistor 338, and transistors 308 and 320. Transistors 308 and 334 provide only base currents, which are relatively small, so the contribution of current sourced by these transistors may be ignored in this discussion relative to that of transistors 320 and 338. For some embodiments, by symmetry, half of the current sourced by transistor 306 is sourced into transistor 338, and the other half is sourced into transistor 320. Similarly, half the current sourced by transistor 330 is sourced into transistor 338, and the other half is sourced into transistor 320. In this way, the same magnitude of current flows through transistors 320 and 338, and the same magnitude of current flows through transistors 306 and 330. With the voltage at node 322 biasing the base of transistor 348, and the voltage at node 346 biasing the base of transistor 350, transistors 348 and 350 are both turned on.

The above description is respect to the quiescent state of the driver stage of FIG. 1C. Now consider the case in which the voltage at input port 102 is higher than the voltage at input port 104, so that the voltage at node 148 is higher than the voltage at node 150, which causes the intermediate stage circuit of FIG. 1B to sink the current $\Delta i'$ from "C" in FIG. 1C into node 204 of the intermediate stage circuit. In this case, the voltage at node 322 is lowered. Because the voltage at node 322 is the emitter voltage of transistor 320, lowering the voltage at node 322 shuts down transistor 320 so that it does not source current into node 346. However, transistor 330 keeps sourcing current, so that it pulls current from the base of transistor 350, as well as pulling current through transistor 338 which pulls current from the base of transistor 348. The intermediate stage circuit of FIG. 1B also sinks the current $\Delta i'$ from "D" in FIG. 1C into node 206 of the intermediate stage circuit, as well as lowers the voltage at node 206. As a result, there is a rapid lowering of the voltages on the bases of transistors 348 and 350. This quickly shuts off transistor 350, and turns transistor 348 on hard. As a result, the driver stage outputs appreciable current to output port 106. For applications in which output port 106 is capacitively loaded because it drives a pass transistor to regulate a load, this means a capacitive load at output port 106 is quickly charged.

For the case in which the voltage at input port 102 is lower than the voltage at input port 104, a discussion similar to the previous case of input voltages discussed above follows for the driver stage of FIG. 1C, but where now the intermediate stage circuit of FIG. 1B sources the current $\Delta i'$ transistor 350 is turned on hard, and transistor 348 is quickly shut off. This results in the driver stage sinking appreciable current from output port 106 to the ground rail, so that a capacitive load on output port 106 may be quickly discharged.

Various modifications may be made to the described embodiments without departing from the scope of the invention as claimed below. For example, each of the stages illustrated in the figures may be used independently of each other. As a more particular example, the input stage illustrated in FIG. 1A need not necessarily be used with the intermediate stage of FIG. 1B. Similarly, the intermediate stage of FIG. 1B need not necessarily be used with the output stage of FIG. 1C. Rather, input stage FIG. 1A may be combined with other stages to form an error amplifier. Similar remarks apply to the stages illustrated in FIGS. 1B and 1C.

It is to be understood in these letters patent that the meaning of "A is connected to B", where A or B may be, for example, a node or device terminal, is that A and B are connected to each other so that the voltage potentials of A and B are substantially equal to each other. (In this and in the next paragraph, A and B are not to be confused with the ports (or nodes) labeled "A" and "B" in the described embodiments.) For example, A and B may be connected together by an interconnect (transmission line). In integrated circuit technology, the interconnect may be exceedingly short, comparable to the device dimension itself. For example, the bases of two transistors may be connected together by polysilicon, or copper interconnect, where the length of the polysilicon, or copper interconnect, is comparable to the spatial dimension of the bases. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

It is also to be understood in these letters patent that a "current source" may mean either a current source or a current sink. Similar remarks apply to similar phrases, such as, "to source current".

It is also to be understood in these letters patent that various circuit components and blocks, such as current mirrors, amplifiers, etc., may include switches so as to be switched in or out of a larger circuit, and yet such circuit components and blocks may still be considered connected to the larger circuit.

What is claimed is:

1. A circuit comprising:
    a first input port and a second input port;
    a first input NPN transistor comprising a base, a collector, and an emitter connected to the first input port;
    a second input NPN transistor comprising a base connected to the base of the first input NPN transistor, a collector, and an emitter connected to the second input port;
    a first node, a second node, and a third node;
    a first AB buffer coupling the collector of the first input NPN transistor to the first node;
    a second AB buffer coupling the collector of the second input NPN transistor to the second node;
    a first resistor having a first terminal connected to the first node and a second terminal to the third node; and
    a second resistor having a first terminal connected to the second node and a second terminal to the third node.

2. The circuit as set forth in claim 1, further comprising:
    a first current source connected to the third node;
    a diode having an anode connected to the third node and a cathode connected to the base of the first input NPN transistor; and
    a second current source connected to the cathode of the diode.

3. The circuit as set forth in claim 1,
    the first AB buffer comprising:
        a first PNP transistor comprising an emitter, and a base connected to the collector of the first input NPN transistor;
        a first NPN transistor comprising a base connected to the first PNP transistor of the first AB buffer, a collector, and an emitter connected to a first node;
        a second NPN transistor comprising an emitter, and a base connected to the collector of the first input NPN transistor; and
        a second PNP transistor comprising a base connected to the emitter of the second NPN transistor of the first AB buffer, a collector, and an emitter connected to a first node; and
    the second AB buffer comprising:
        a first PNP transistor comprising an emitter, and a base connected to the collector of the second input NPN transistor;
        a first NPN transistor comprising a base connected to the first PNP transistor of the second AB buffer, a collector, and an emitter connected to a second node;
        a second NPN transistor comprising an emitter, and a base connected to the collector of the second input NPN transistor; and
        a second PNP transistor comprising a base connected to the emitter of the second NPN transistor of the second AB buffer, a collector, and an emitter connected to a second node.

4. The circuit as set forth in claim 3, further comprising:
    a first current source connected to the third node;
    a diode having an anode connected to the third node and a cathode connected to the base of the first input NPN transistor; and
    a second current source connected to the cathode of the diode.

5. The circuit as set forth in claim 4, further comprising:
    a third current source;
    a third resistor coupling the third current source to the collector of the first input NPN transistor; and
    a fourth resistor coupling the third current source to the collector of the second input NPN transistor.

6. The circuit as set forth in claim 5, further comprising:
    a first current mirror comprising a first PNP transistor comprising a collector connected to the collector of the first NPN transistor of the first AB buffer, and a base; and a second PNP transistor comprising a collector connected to the collector of the first NPN transistor of the second AB buffer, and a base connected to the base of the first PNP transistor of the first current mirror and to the collector of the second PNP transistor of the first current mirror; and
    a second current mirror comprising a first NPN transistor comprising a collector connected to the collector of the second PNP transistor of the first AB buffer, and a base; and a second NPN transistor comprising a collector connected to the collector of the second PNP transistor of the second AB buffer, and a base connected to the base of the first NPN transistor of the second current mirror and to the collector of the second NPN transistor of the second current mirror.

7. The circuit as set forth in claim 3, further comprising:
    a first current mirror comprising a first PNP transistor comprising a collector connected to the collector of the first NPN transistor of the first AB buffer, and a base; and a second PNP transistor comprising a collector connected to the collector of the first NPN transistor of the second AB buffer, and a base connected to the base of the first PNP transistor of the first current mirror and to the collector of the second PNP transistor of the first current mirror; and
    a second current mirror comprising a first NPN transistor comprising a collector connected to the collector of the second PNP transistor of the first AB buffer, and a base; and a second NPN transistor comprising a collector connected to the collector of the second PNP transistor of the second AB buffer, and a base connected to the base of the first NPN transistor of the second current mirror and to the collector of the second NPN transistor of the second current mirror.

* * * * *